(12) United States Patent
Towle

(10) Patent No.: US 7,369,718 B2
(45) Date of Patent: May 6, 2008

(54) PACKAGE SUBSTRATE PATTERN TO ACCOMMODATE OPTICAL WAVEGUIDE

(75) Inventor: Steven Towle, deceased, late of Phoenix, AZ (US); by Anna M. George, legal representative, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/883,603

(22) Filed: Jun. 30, 2004

(65) Prior Publication Data

US 2005/0161789 A1 Jul. 28, 2005

Related U.S. Application Data

(60) Provisional application No. 60/539,052, filed on Jan. 23, 2004.

(51) Int. Cl.
G02B 6/12 (2006.01)
(52) U.S. Cl. .................. 385/14; 385/88; 257/678
(58) Field of Classification Search .............. None
See application file for complete search history.

(56) References Cited

U.S. PATENT DOCUMENTS

| | | | |
|---|---|---|---|
| 5,009,476 A | | 4/1991 | Reid et al. |
| 5,764,832 A | * | 6/1998 | Tabuchi ................. 385/49 |
| 5,987,202 A | * | 11/1999 | Gruenwald et al. ....... 385/49 |
| 6,163,835 A | * | 12/2000 | Todd et al. ............. 712/34 |
| 6,343,164 B1 | * | 1/2002 | Robertsson et al. ....... 385/14 |
| 6,477,296 B1 | * | 11/2002 | Ogawa .................. 385/31 |
| 2002/0040983 A1 | * | 4/2002 | Fitzergald ............. 257/183 |
| 2002/0096686 A1 | * | 7/2002 | Raj et al. ............. 257/79 |
| 2002/0131727 A1 | * | 9/2002 | Reedy et al. ........... 385/88 |
| 2003/0103712 A1 | * | 6/2003 | Giebov et al. .......... 385/14 |

FOREIGN PATENT DOCUMENTS

JP 2004069824 3/2004
WO PCT/US2005/022225 10/2005

OTHER PUBLICATIONS

Mohammed, E. M., et al., "Optical I/O Technology for VLSI", Intel Corporation.

* cited by examiner

Primary Examiner—Ivan Pert
Assistant Examiner—Benjamin P. Sandvik
(74) Attorney, Agent, or Firm—Blakely, Sokoloff, Taylor & Zafman LLP

(57) ABSTRACT

An apparatus comprising a substrate comprising a base substrate, a conductive layer on the base substrate, and a solder resist layer on the conductive layer, a die including an optical area, the die being flip-chip bonded to the substrate, and an optical inter-connector optically coupled to the optical area and at least partially positioned between the die and the base substrate, the optical inter-connector positioned in a trench formed in the solder resist layer and the conductive layer. A process comprising providing a substrate comprising a base substrate, a conductive layer on the base substrate, and a solder resist layer on the conductive layer, forming a trench in the conductive layer and the solder resist layer, positioning a waveguide in the trench, and flip-chip bonding a die to the substrate, the die including an optical area, such that the optical area is optically coupled to the waveguide.

28 Claims, 5 Drawing Sheets

PACKAGE SUBSTRATE PATTERN TO ACCOMMODATE OPTICAL WAVEGUIDE

CROSS-REFERENCE TO RELATED APPLICATIONS

This utility application claims priority under 35 U.S.C. §119(e) to U.S. Provisional Patent Application Ser. No. 60/539,052, filed Jan. 23, 2004.

TECHNICAL FIELD

The present invention relates generally to packaging of semiconductor optical devices and in particular, but not exclusively, to packaging of optical dies that are optically coupled to a waveguide.

BACKGROUND

Optical flip chip packages often include a substrate, a waveguide mounted on the substrate, and a flip chip die optically coupled to the waveguide. To achieve acceptable optical coupling between the optical flip chip die and the optical waveguide, the distance between the flip chip die and the substrate is controlled. If the distance between the flip chip die and the substrate is too large, optical coupling between the optical waveguide and the optical flip chip die may be less than optimal due to optical beam divergence. Conversely, if the distance between the flip chip die and the substrate is too small the optical waveguide and/or the optical flip chip die can be damaged during bonding of the chip to the substrate.

Methods of maintaining or increasing separation distance between the optical flip chip die and the substrate include using larger-than-normal solder balls to attach the optical flip chip die to the substrate. As optical flip chip packages exhibit increasingly finer pitch (i.e., as components become smaller and more densely packed together) and higher input/output density, solder bridging has started to occur. "Solder bridging" refers to electrical shorts created during soldering when solder melts and inadvertently connects adjacent or nearby electrical contacts. Increasing the amount of solder between the flip chip and the substrate increases the likelihood of solder bridging. Therefore, using larger solder balls to achieve a desired separation between the optical flip chip die and the substrate during the bonding process increases the likelihood of solder bridging.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Figure 1A:
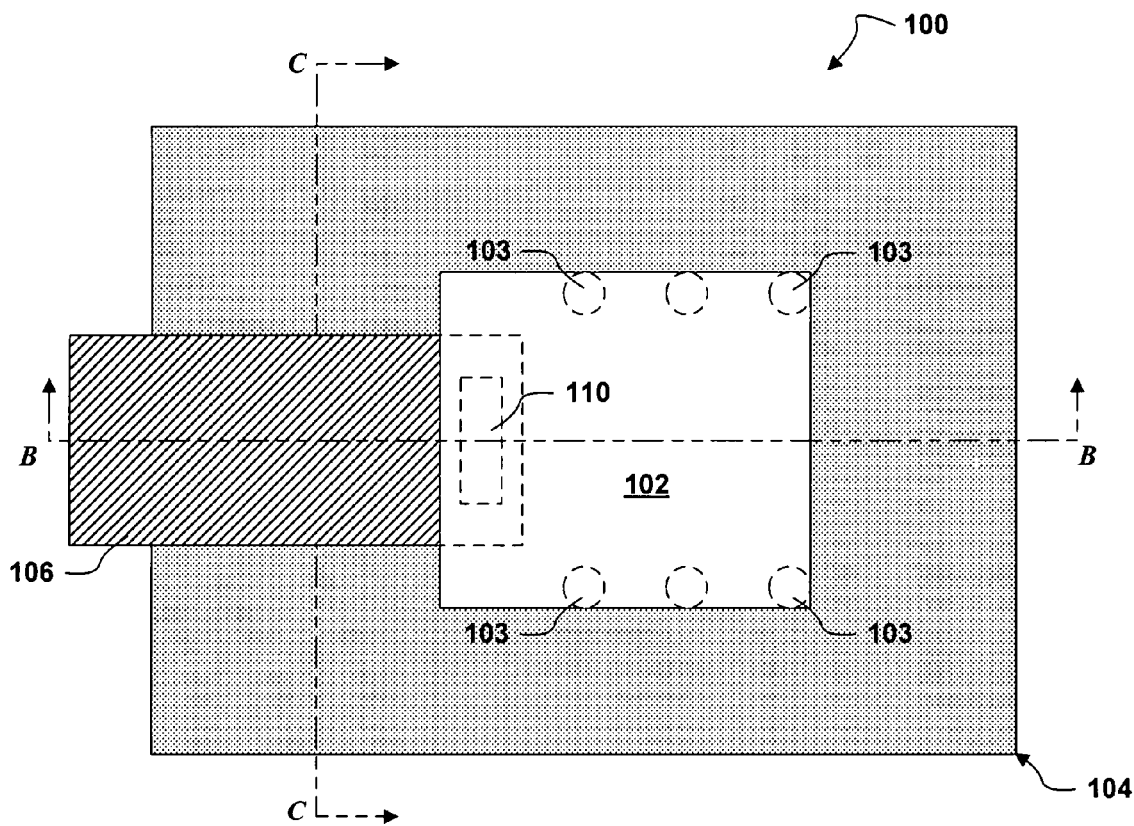
FIG. 1A is a plan view of an embodiment of a die flip-chip bonded to a substrate and optically coupled to a waveguide.

Embodiments of an apparatus, process and system for a flip-chip package that accommodates at least one optical waveguide are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

FIGS. 1A-1D together illustrate an embodiment of the invention comprising an optical device 100. As seen in plan view in FIG. 1A, the optical device 100 comprises an optical die 102 flip-chip bonded to a substrate 104 using a plurality of solder ball joints 103. An optical inter-connector, which in this embodiment is a waveguide 106, is at least partially positioned between the optical die 102 and the substrate 104, and therefore occupies at least part of the space between the optical die 102 and the substrate 104. The waveguide 106 is optically coupled to an optical area 110 of the die 102. In addition to having a portion underneath the die 102, the waveguide projects from underneath the die 102 and extends to another component such as another die to form an optical interconnect between components for example as shown in and described with respect to FIG. 3. Although only one waveguide is used in the illustrated embodiment, in other embodiments multiple waveguides could be used. For example, multiple waveguides can be used to carry signals in different directions to or from a single optical area 110 of the die, or multiple waveguides can be used to carry multiple signals to and from multiple optical areas in the die.

Figure 1B:
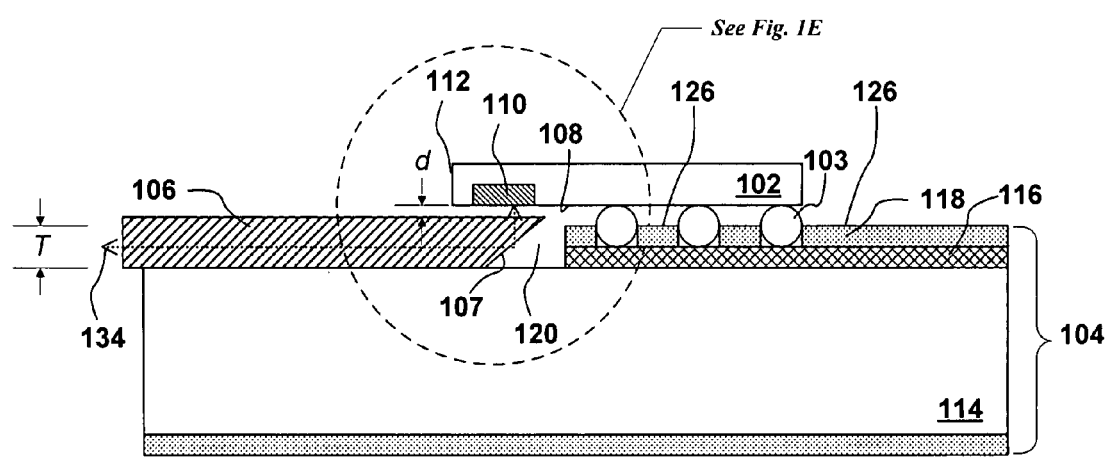
FIG. 1B is a side elevation of an embodiment of a die flip-chip bonded to a substrate and optically coupled to a waveguide, taken substantially along section line B-B in FIG. 1A.

FIG. 1B illustrates details of the embodiment of the device 100. The substrate 104 includes a base substrate 114 on which are layered a conductive layer 116 and a solder resist layer 118. The base substrate 114 can comprise a single material such as a semiconductor (e.g., silicon), an organic material (e.g., bismaleimide triazine) or a ceramic material (e.g., a high-temperature or low-temperature co-fired ceramic), or can comprise a plurality of different layers of differing materials. In one embodiment, for instance, the base substrate 114 can comprise a core layer with alternating layers of dielectrics and conductors layered on either side of the core. The conductive layer 116 is deposited onto the base substrate; in one embodiment, the conductive layer is made from copper (Cu), but in alternative embodiments it can comprise other conductive materials such as gold (Au), silver (Ag) or aluminum (Al) as well as other metals or combinations or alloys of metals. Conductive non-metals can also be used for the conductive layer 116. The solder resist layer 118 is deposited on the conductive layer 116 to resist the effects of solder from flip-chip bonding or other connections to the substrate. In other words, the solder resist layer prevents undesired contacts between the solder and the conductive layer 116.

The optical die 102 is attached to the substrate 104 using a plurality of solder ball joints 103. The solder ball joints attach the optical die 102 to the substrate 104, suspend the optical die above the substrate, and provide electrical connections between the die and one or more conductive layers on or within the substrate 104. The optical die 102 includes at least one optical area 110 on the surface 108. Examples of optically active components that can be used on the die 102 include electromagnetic radiation sources such as vertical-cavity surface-emitting lasers (VCSELs), or radiation detectors such as photo-detectors, photodiodes and the like. Examples of optically passive components that can be used on the die 102 include coupling devices such as mirrors, diffraction gratings, evanescent-wave couplers, tapered waveguides and the like. Other embodiments can, of course, include more, less, or different optical areas than those shown or listed. Similarly, other embodiments can include different or additional optical areas positioned on other surfaces of the optical die 102 besides the surface 108, for example on the surface of the die not facing the substrate.

The waveguide 106 has thickness T and is positioned so that at least part of the waveguide lies in the space between the substrate 104 and the lower surface 108 of the optical die. The remaining portion of the waveguide projects out from under an edge 112 of the optical die 102 and can extend, for example, to another optical component or die to form an optical interconnect between optical dies (see, e.g., FIG. 3). The width of the waveguide is such that it fits between solder ball joints 103.

In some cases the thickness T of the waveguide 106 is greater than the distance between the lower surface 108 of the die and the surface 126 of the solder resist layer 118. To create enough clearance between the surface 108 of the die and the substrate so that the waveguide can be inserted, the waveguide is positioned in a trench 120 that, like the waveguide itself, is at least partially underneath the die and projects away from the die to another optical component. The waveguide 106 is positioned in the trench 120 such that its angled end 107 is positioned to either receive radiation from the optical area 110 and reflect it into the waveguide (e.g., where the optical area comprises a radiation source), or to receive radiation from the waveguide and reflect it into the optical area 110 (e.g., where the optical area 110 comprises a radiation detector). In one embodiment, the waveguide 106 comprises an optically transparent portion surrounded by cladding, although different waveguide constructions are possible in other embodiments.

Figure 1C:
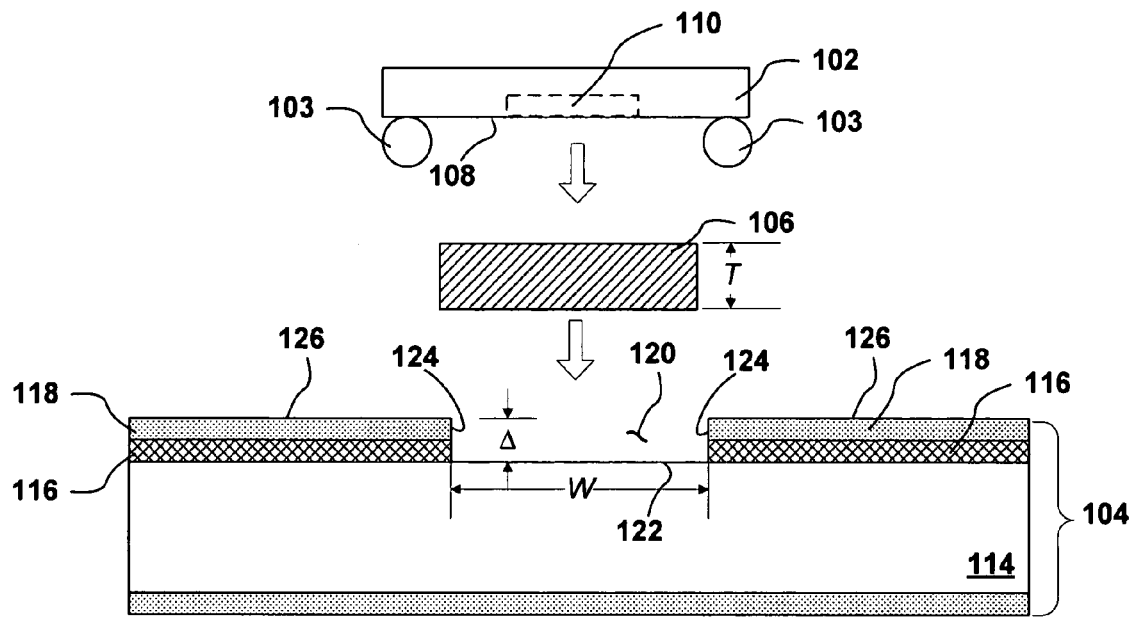
FIG. 1C is an exploded front elevation of an embodiment of a die flip-chip bonded to a substrate and optically coupled to a waveguide, taken substantially along section line C-C in FIG. 1A.
Figure 1D:
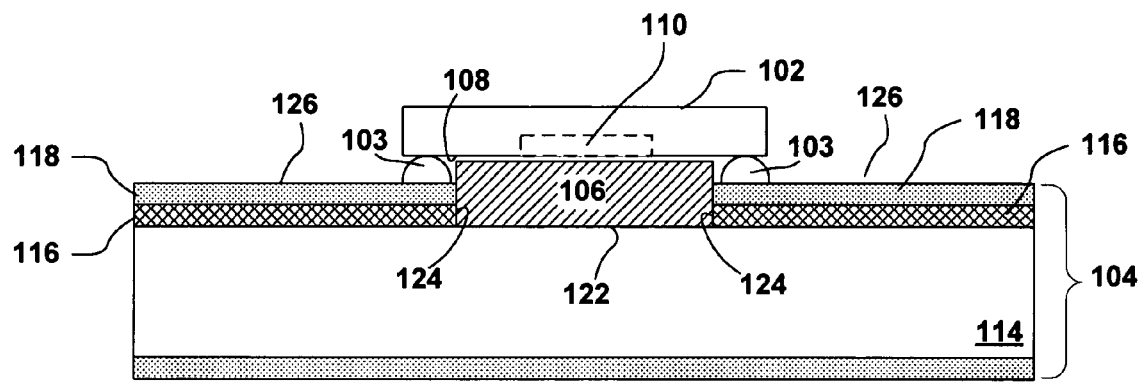
FIG. 1D is a side elevation showing the embodiment of FIG. 1C in its completed state.

FIGS. 1C and 1D are front elevations of the optical device 100 illustrating an embodiment of the construction of the trench 120; FIG. 1C is an exploded view, while FIG. 1D shows the components in their final positions. The trench 120 has a bottom 122 and a pair of sidewalls 124, and has a depth $\Delta$ and a width W. In the embodiment shown, the width of the waveguide 106 substantially equals the width W of the trench. This arrangement is advantageous because the trench can then be used as a mechanical means of aligning the waveguide. In other embodiments, however, the widths of the trench and the waveguide need not be substantially equal. In other words, the width of the waveguide can take any value less than or equal to the width W of the trench.

As discussed above, in some cases the thickness T of the waveguide 106 is greater than the distance between the lower surface 108 of the die and the surface 126 of the solder resist layer 118. To create enough space so that the waveguide can be inserted, the depth $\Delta$ of the trench is selected so that it can accommodate the thickness T of the waveguide with an additional margin d between the waveguide and the optical area 110. In the embodiment shown, the trench 120 is patterned and etched in the solder resist layer 118 and the conductive layer 116 to expand the gap between the bottom surface 108 of the die and the bottom of the trench. Etching, however, is only one method of forming the trench. In other embodiments the solder mask may be printed selectively, avoiding the trench area, or material can be removed by micromachining or laser ablation. However the trench is created, the resulting gap should be large enough to accommodate a waveguide of thickness T between the bottom surface 108 of the die and the substrate.

In the embodiment shown, the solder resist layer 118 and the conductive layer 116 are absent in the trench, so that the depth $\Delta$ of the trench is substantially equal to the sum of the thicknesses of these two layers. In other embodiments, however, the trench can be formed by leaving out all or part of the solder resist layer only, or by leaving out all of the solder resist layer and parts of the conductive layer. In still other embodiments, the trench can be made even deeper by implicating additional layers, conductive or otherwise, in the core substrate. For a particular value of the thickness T, the margin d between the bottom surface 108 of the die and the top of the waveguide can be adjusted by varying the depth of the trench, depending on how the waveguide will be optically coupled to the optical area 110. The margin d can range from essentially zero to any value that results in acceptable optical coupling.

Figure 1E:
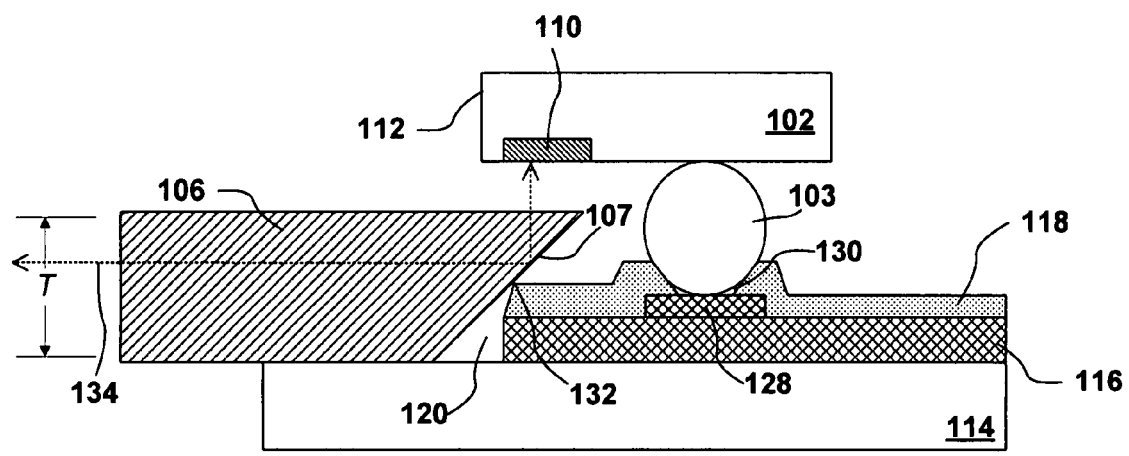
FIG. 1E is an enlarged side elevation of the area shown in the dashed circle of FIG. 1B.

FIG. 1E further illustrates details of coupling the waveguide 106 to the optical area 110 of the die 102. As described previously, the die 102 is flip-chip mounted on the substrate 104 using solder balls 103. In preparation for flip-chip bonding the die to the substrate, a small pad 128 is deposited on or formed as part of the conductive layer 116 to provide a contact area between the solder ball 103 and the layer 116. The solder resist layer is formed in such a way to create a well or depression 130 into which the solder ball 103 will be inserted. The well 130 helps in the alignment of the die 102 during flip-chip bonding, and helps to contain the liquid solder during bonding so that it does not run into other areas of the substrate and create solder bridging problems.

The waveguide 106 can be put in place either before or after flip-chip bonding of the die 102. In either case, the waveguide 106 is placed in the trench 120 such that at least part of the waveguide is positioned between the lower surface 108 of the die and the substrate. For proper optical coupling, the waveguide should be positioned such that the angled end 107 is substantially aligned with the optical area 110 of the die. To assist in properly positioning the waveguide 106, the trench 120 can be formed taking account of the thickness T of the waveguide 106 and the angle of the angled end 107 such that a corner 132 of the solder resist layer provides a mechanical stop for the waveguide. The trench 120 itself then provides automatic lateral alignment of the waveguide, while the corner 132 provides automatic longitudinal alignment of the waveguide. Although shown in the figure as a separate piece that is inserted into the trench, the waveguide 106 could also be formed on-site in the trench.

With the angled end 107 substantially aligned with the optical area 110, an optical signal 134 emitted from the optical area 110 enters the waveguide 106 and is reflected from the angled end 107 into the waveguide to be transmitted elsewhere by the waveguide. In an instance where the optical area 110 is designed to receive radiation rather than to transmit, the optical signal 134 is carried in the waveguide, and is reflected from the angled end 107 into the optically active area. The angled end 107 could also be replaced by another deflecting element such as a volume diffraction grating or by one arm of a coupling device, with the other arm located in the optical area 110 on the die 102.

Figure 2A:
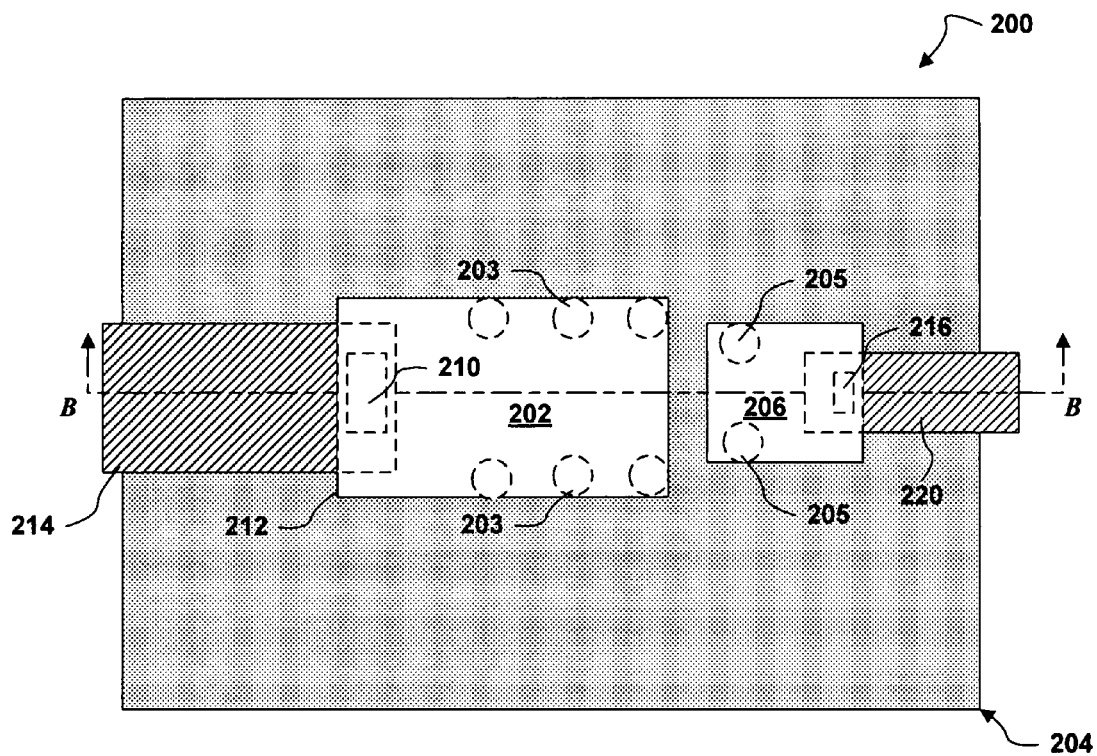
FIG. 2A is a plan view of an alternative embodiment comprising multiple dies flip-chip bonded to a substrate and optically coupled to waveguides.
Figure 2B:
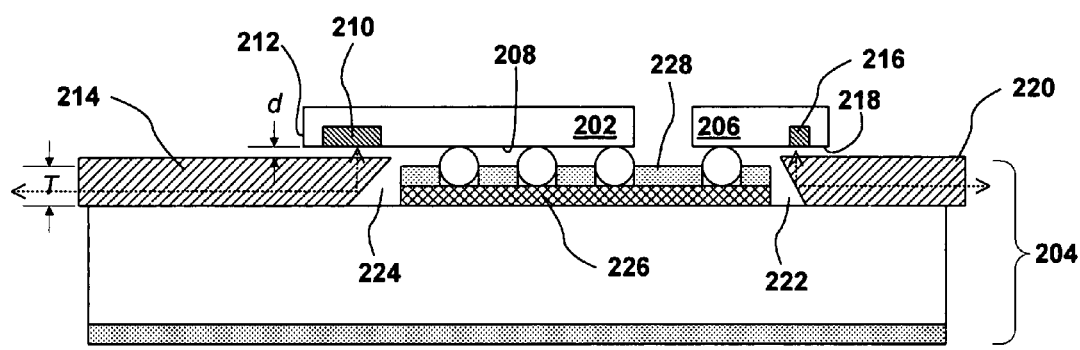
FIG. 2B is a side elevation of the alternative embodiment of dies flip-chip bonded to a substrate and optically coupled to waveguides as shown in FIG. 2A.

FIGS. 2A and 2B together illustrate an alternative embodiment of the invention comprising an optical device 200. In contrast to the optical device 100, the optical device 200 includes multiple flip-chip dies on a substrate instead of only one die. The optical device 200 thus comprises a substrate 204 to which are flip-chip bonded a first die 202 and a second die 206. The first die 202 includes an optical area 210 and is optically coupled to a first optical inter-connector, which in the embodiment shown is a waveguide 214. The second die 206 also includes an optical area 216 that is optically coupled to a second optical inter-connector, which in this embodiment is also a waveguide 220.

As in the optical device 100, the substrate 204 comprises a base substrate on which are layered a conductive layer 226 and a solder resist layer 228. The base substrate can comprise a single material such as a semiconductor (e.g., silicon), an organic material (e.g., bismaleimide triazine) or a ceramic material (e.g., a high-temperature or low-temperature co-fired ceramic), or can comprise a plurality of different layers of differing materials. Both the waveguide 214 and the waveguide 220 are positioned on the substrate 204 substantially as shown for the optical device 100 (see FIGS. 1A-1E). In other words, the waveguide 214 is positioned in a trench 224 formed in the solder resist layer 228 and the conductive layer 226. Similarly, the waveguide 220 is positioned in a trench 222 also formed in the solder resist layer 228 and the conductive layer 226. As in the optical device 100, the trenches 222 and 224 create enough space between their respective dies and the substrate so that the waveguides can be inserted between the dies and the substrate. Also as before, the trenches 222 and 224 can function as mechanical alignment guides to ensure proper alignment of the waveguides with the optical areas of their respective dies.

Figure 3:
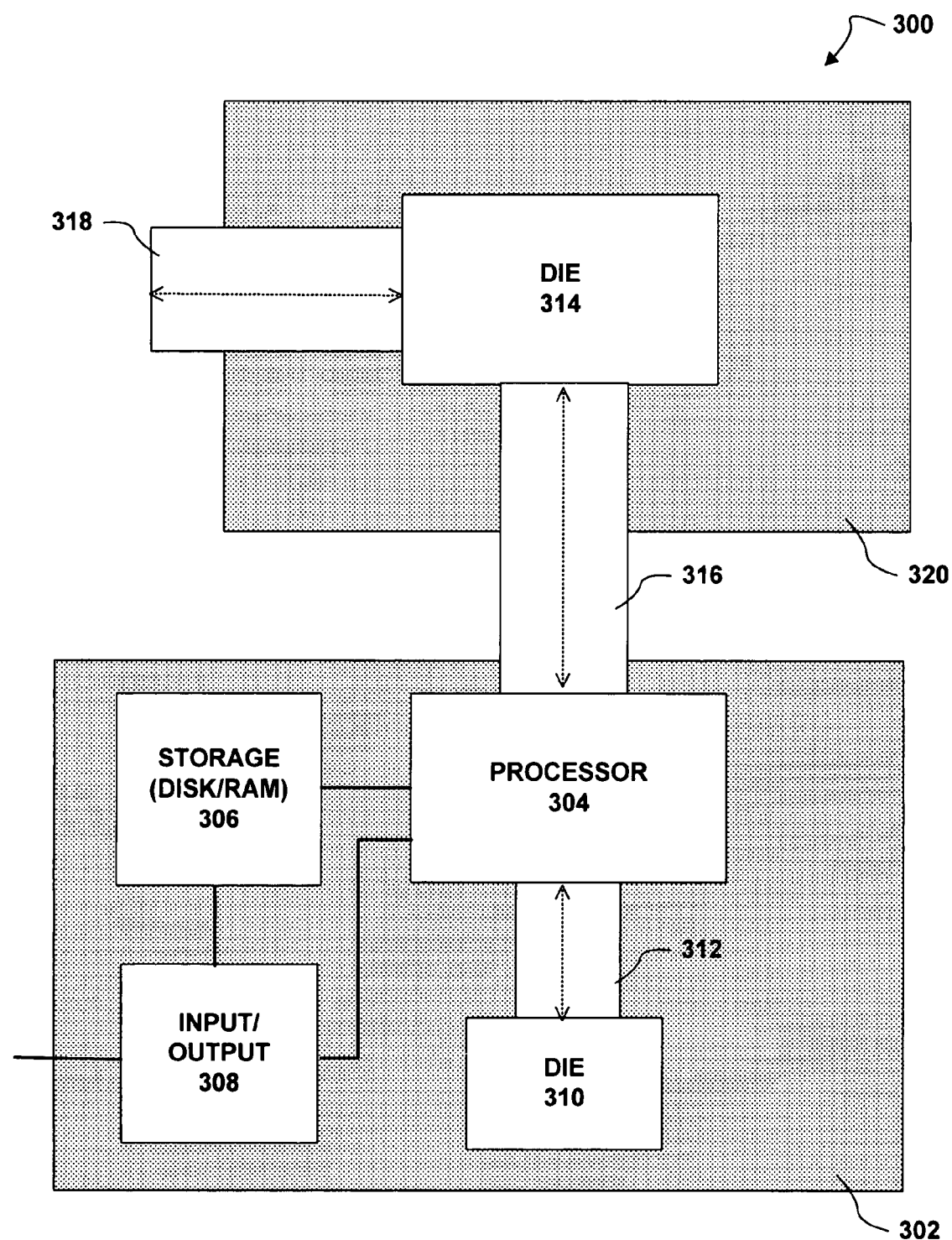
FIG. 3 is a plan view of an embodiment of a system according to the invention with multiple dies on the same or different substrates optically coupled using waveguides.

FIG. 3 illustrates yet another alternative embodiment of the invention comprising an optical system 300. The system 300 comprises a flip-chip processor 304 that is flip-chip mounted to a substrate 302. In one embodiment, the substrate 302 can have a similar construction to the substrate 104 described in connection with the device 100. The processor 304 comprises a flip-chip die including a pair of optical areas, for example as shown in connection with the die 102 of the optical device 100. The optical areas can include optical sources, optical detectors, coupling elements, and the like.

The processor 304 is coupled to a storage device 306, which in various embodiments can be a non-volatile memory such as a dynamic random access memory (DRAM), synchronous dynamic random access memory (SDRAM), flash random access memory (RAM), and the like. The processor 304 is also coupled to an input/output device 308 that allows the processor to send and receive commands and data to and from devices outside the system. The processor can also be coupled to a volatile memory, such as dynamic random access memory (DRAM) or synchronous dynamic random access memory (SDRAM). Although shown in this embodiment as electrically coupled to the processor 304, in alternative embodiments the storage unit 306 and input/output unit 308 can be optically coupled to the processor.

The processor 304 is coupled to another flip-chip die 310 by a waveguide 312. The flip-chip die 310 is on the same substrate 302 as the processor 304. The processor 304 is also coupled via waveguide 316 to another flip-chip die 314 on a separate substrate 320. The waveguides are positioned and mounted on their respective substrates 302 and 320 substantially as shown for the optical device 100—that is, positioned in trenches formed in a solder resist layer and a conductive layer on the surface of the substrate.

In one mode of operation of the device 300, the processor reads instructions or data from the storage unit 306 or receives instructions or data from the input/output unit 308. The processor performs some operation on the data or instructions and optically transmits the data or instructions to one or both of the dies 310 and 314 via the waveguides 312 and 316. The optical dies 310 and 314 may then perform further operations on the data or instructions, including, in the case of the die 314, transmitting the data or instructions to other dies via the waveguide 318. In a second mode of operation, the processor 304 receives data optically from one or more of the dies 310 and 314 via waveguides 316 and 312, respectively. The processor then stores this information in the storage device 306 or sends it to the input/output device 308.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
    a substrate including a base substrate, a conductive layer on the base substrate, and a solder resist layer on the conductive layer;
    a die including an optical area, the die being flip-chip bonded to the substrate with the optical area positioned on a surface of the die that faces the substrate;
    a trench formed in at least the solder resist layer, wherein the trench includes a bottom and wherein at least part of the trench is between the base substrate and the surface of the die that faces the substrate; and
    an optical inter-connector positioned in the trench and optically coupled to the optical area, wherein the optical inter-connector has an end between the bottom of the trench and the surface of the die that faces the substrate.

2. The apparatus of claim 1 wherein the substrate comprises at least one or more of conductive layers and dielectric layers.

3. The apparatus of claim 1 wherein the optical area contains a detector or a source.

4. The apparatus of claim 3 wherein the optical area contains a vertical-cavity surface-emitting laser or a photo-detector.

5. The apparatus of claim 1 wherein the cross-section of the trench is substantially similar to the cross-sectional shape of the optical inter-connector.

6. The apparatus of claim 1 wherein the optical inter-connector is a waveguide.

7. The apparatus of claim 6 wherein the waveguide includes an end surface positioned at an angle relative to an axis of the waveguide, wherein the end surface optically couples the waveguide to the optical area of the die.

8. The apparatus of claim 1 wherein the trench in the solder resist layer and the conductive layer is formed by patterning and etching.

9. A system comprising:
a substrate comprising a base substrate, a conductive layer on the base substrate, and a solder resist layer on the conductive layer;
a random access memory mounted on the substrate;
a first die coupled to the memory, wherein the first die includes an optical area and is flip-chip bonded to the substrate with the optical area positioned on a surface of the die that faces the substrate;
a second die including an optical area, wherein the second die is flip-chip bonded to the substrate with the optical area positioned on a surface of the second die that faces the substrate;
a trench formed in at least the solder resist layer, the trench having a bottom and extending between the first die and the second die, wherein at least part of the trench is between the base substrate and the surface of the first die that faces the substrate and at least part of the trench is between the base substrate and the surface of the second die that faces the substrate; and
an optical inter-connector positioned in the trench and optically coupled to the optical areas of the first die and the second die, wherein the optical inter-connector has one end positioned between the bottom of the trench and the surface of the first die that faces the substrate and has another end positioned between the bottom of the trench and the surface of the second die that faces the substrate.

10. The system of claim 9, further comprising an input/output device mounted on the substrate, the input/output device being coupled to the first die.

11. The system of claim 9 wherein the first die is a microprocessor.

12. The system of claim 9 wherein the optical inter-connector is a waveguide.

13. The system of claim 12 wherein the waveguide includes end surfaces positioned at an angle relative to an axis of the waveguide, wherein the end surfaces optically couple the waveguide to the optical areas of the dies.

14. The system of claim 9 wherein the optical area contains a detector or a source.

15. The system of claim 14 wherein the optical area contains a vertical-cavity surface-emitting laser or a photodetector.

16. The system of claim 9 wherein the trench is formed by patterning and etching.

17. The system of claim 9 wherein the cross-section of the trench is substantially similar to the cross-sectional shape of the optical inter-connector.

18. An apparatus comprising:
a substrate including a base substrate, a conductive layer on the base substrate, and a solder resist layer on the conductive layer;
a die including an optical area, the die being flip-chip bonded to the substrate with the optical area positioned on a surface of the die that faces the substrate;
a trench formed in at least the solder resist layer, wherein the trench includes a bottom and wherein at least part of the trench is between the base substrate and the surface of the die that faces the substrate; and
an optical inter-connector positioned in the trench and optically coupled to the optical area, wherein the optical inter-connector has an end between the bottom of the trench and the surface of the die that faces the substrate and wherein the cross-section of the trench is substantially similar to the cross-sectional shape of the optical inter-connector.

19. The apparatus of claim 18 wherein the substrate comprises at least one or more of conductive layers and dielectric layers.

20. The apparatus of claim 18 wherein the optical area contains a detector or a source.

21. The apparatus of claim 18 wherein the optical inter-connector is a waveguide.

22. The apparatus of claim 21 wherein the waveguide includes an end surface positioned at an angle relative to an axis of the waveguide, wherein the end surface optically couples the waveguide to the optical area of the die.

23. A system comprising:
a substrate comprising a base substrate, a conductive layer on the base substrate, and a solder resist layer on the conductive layer;
a random access memory mounted on the substrate;
a first die coupled to the memory, wherein the first die includes an optical area and is flip-chip bonded to the substrate with the optical area positioned on a surface of the die that faces the substrate;
a second die including an optical area, wherein the second die is flip-chip bonded to the substrate with the optical area positioned on a surface of the second die that faces the substrate;
a trench formed in at least the solder resist layer, the trench having a bottom and extending between the first die and the second die, wherein at least part of the trench is between the base substrate and the surface of the first die that faces the substrate and at least part of the trench is between the base substrate and the surface of the second die that faces the substrate; and
an optical inter-connector positioned in the trench and optically coupled to the optical areas of the first die and the second die, wherein the optical inter-connector has one end positioned between the bottom of the trench and the surface of the first die that faces the substrate and has another end positioned between the bottom of the trench and the surface of the second die that faces the substrate, and wherein the cross-section of the trench is substantially similar to the cross-sectional shape of the optical inter-connector.

24. The system of claim 23, further comprising an input/output device mounted on the substrate, the input/output device being coupled to the first die.

25. The system of claim 23 wherein the optical inter-connector is a waveguide.

26. The system of claim 25 wherein the waveguide includes end surfaces positioned at an angle relative to an axis of the waveguide, wherein the end surfaces optically couple the waveguide to the optical areas of the dies.

27. The system of claim 23 wherein the optical area contains a detector or a source.

28. The system of claim 23 wherein the optical area contains a vertical-cavity surface-emitting laser or a photodetector.

* * * * *